United States Patent [19]

Kaplan et al.

[11] 4,321,420

[45] Mar. 23, 1982

[54] PROCESS FOR PRODUCING A LAYER CONTAINING SILICON AND PHOTOELECTRIC CONVERSION DEVICE UTILIZING THIS PROCESS

[75] Inventors: Daniel Kaplan; Nicole Sol; Pierre Landouar, all of Paris, France

[73] Assignee: Thomson-CSF, Paris, France

[21] Appl. No.: 173,431

[22] Filed: Jul. 29, 1980

[30] Foreign Application Priority Data

Aug. 3, 1979 [FR] France ................................ 79 19972

[51] Int. Cl.³ ...................... H01L 31/06; H01L 31/18
[52] U.S. Cl. .................................... 136/255; 136/258; 148/1.5; 357/2; 357/15; 357/30; 427/39; 427/74; 427/84; 427/86; 423/349
[58] Field of Search ...................... 427/39, 74, 84, 86; 148/1.5; 136/255, 258; 357/2, 15, 30; 423/349

[56] References Cited

U.S. PATENT DOCUMENTS 4,064,521 12/1977 Carlson .................................... 357/2
4,151,058 4/1979 Kaplan et al. .................... 204/192 S

OTHER PUBLICATIONS

T. Nakashita et al., "Electronic Density of States in Chemically Vapor-Deposited Amorphous Silicon", *Japan J. Appl. Phys.*, vol. 18, No. 2, pp. 405-406, Feb. 1979.

*Primary Examiner*—Aaron Weisstuch
*Attorney, Agent, or Firm*—Oblon, Fisher, Spivak, McClelland & Maier

[57] ABSTRACT

Process for producing layers of silicon or one of its alloys in pure or doped form and able to absorb optical radiation, the layers being of limited thickness, it comprising a first stage of depositing the layer by chemical decomposition of a gaseous mixture containing silane at a temperature close to the crystallization temperature and a second stage of treating in a hydrogen plasma at a lower temperature.

13 Claims, 1 Drawing Figure

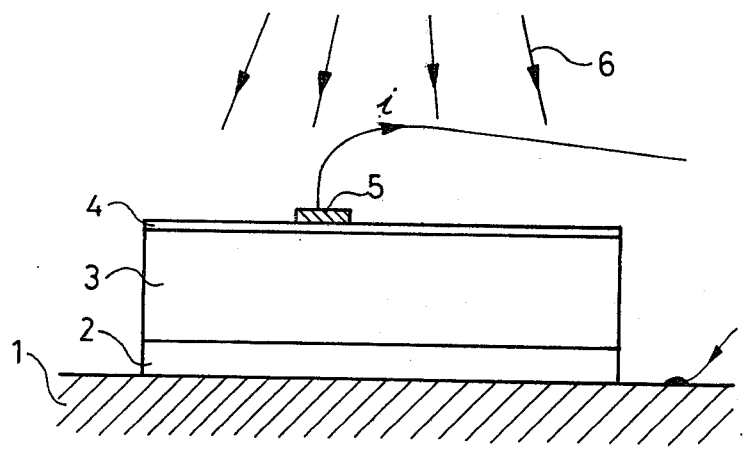

PROCESS FOR PRODUCING A LAYER CONTAINING SILICON AND PHOTOELECTRIC CONVERSION DEVICE UTILIZING THIS PROCESS

BACKGROUND OF THE INVENTION

The present invention relates to a process for producing electronic devices incorporating a layer of silicon or one of its alloys, more particularly, photovoltaic cells usable for converting photon radiation into electric energy.

Photovoltaic cells generally incorporate a multilayer structure, for example, a p-n junction or a metal-semiconductor contact. Silicon is generally used as the material. In its monocrystalline or polycrystalline form with macroscopic grains of sizes exceeding $10^{-5}$ cm, silicon absorbs little light, so that the minimum thickness of the layer to be deposited for obtaining an appropriate efficiency is roughly a few dozen microns. To reduce the cost of cells it is desirable to use the thinnest possible layers, of the order of one micron. For this purpose it is possible to use amorphous silicon, whose optical absorption is well above that of crystalline silicon. However, amorphous silicon obtained, for example, by low temperature decomposition of silane, generally has inferior electrical characteristics to crystalline silicon. For example, the mobility of the electrons is approximately $0.1\ cm^{-2}V^{-1}s^{-1}$, compared with that of crystalline silicon, which can be approximately $10^{-3}\ cm^{-2}V^{-1}s^{-1}$.

French patent application No. 77 17 245, filed by the present assignee and published as No. 2 394 173, proposes a process for producing devices incorporating an amorphous silicon layer, making it possible to improve the electrical properties of the layer. This process consists of depositing the amorphous silicon layer by evaporation or atomization in vacuo or at reduced pressure and at a low temperature. This is followed by a heat treatment of the deposited layer in a hydrogen plasma or in a plasma of one of its isotopes at a relatively low temperature, so that the silicon does not crystallize. The hydrogenation process applied to the amorphous silicon makes it possible to control the hydrogen proportion contained in the material, which is not easy in the case of silane decomposition in a glow discharge. The advantages obtained are mainly based on flexibility of the preparation mode, but the better electrical characteristics obtained remain similar. However, when a doped silicon layer is required the deposition method used does not make it possible to bring about an easy introduction of the dopant.

It has been found that by using a deposition method involving thermal dissociation at high temperature, i.e. close to the crystallization temperature of the deposited material (pure or doped silicon) after hydrogenation the results obtained are much better than those obtained with the known processes. At this temperature the layer has a hybrid structure between the amorphous form and a polycrystalline form with very fine grains. After treatment in a hydrogen plasma the conductivity values obtained are closer to the corresponding values for monocrystals and the optical absorption values are virtually as high as those obtained by the prior art process, i.e. the values obtained with amorphous layers.

BRIEF DESCRIPTION OF THE INVENTION

The present invention therefore relates to a process for producing a layer containing silicon, comprising a first, deposition stage by chemical decomposition of a gaseous mixture containing silane and a second, heat treatment stage of the deposited layer in the atmosphere of a plasma containing hydrogen or one of its isotopes at a temperature below the crystallization temperature of the layer.

Due to the high conductivity and optical absorption of the layers obtained by such a process, the latter is particularly interesting for producing devices for converting optical energy into electrical energy, more specifically, solar cells.

DESCRIPTION OF THE DRAWING AND PREFERRED EMBODIMENTS

The invention is described in greater detail hereinafter relative to non-limitative embodiments and with reference to the attached drawing, which shows a construction of a solar cell in which the process of the invention is utilized.

The process of the invention aims at obtaining a layer of silicon or one of its alloys in pure or doped form in predetermined proportions on a random substrate. It consists of two successive stages:

FIRST STAGE

This consists of the actual decomposition of the chosen material on the substrate. In the case of doped silicon, to obtain an n type layer the doping material can be, for example, arsenic or phosphorus and to obtain a p type layer the doping material can, for example, be boron or gallium. Deposition takes place by chemical decomposition in the vapour phase of a gaseous mixture incorporating silane and, if applicable, another gas supplying the dopant, for example arsine for arsenic and diborane for boron in precise proportions according to the degree of doping desired. Typically this can vary between $10^{-6}$ and $10^{-3}$ molecules of doping gas for one molecule of silane, the maximum corresponding to a so-called n+ or p+ layer. The mixture is diluted in a gas such as, for example, hydrogen or argon. Decomposition is performed at a temperature chosen in the range close to the crystallization temperature of the material. The substrate on which the layer is deposited is dependent on the structure of the envisaged electronic device. For example, the process can permit the deposition of a thin n type layer (the thickness can be approximately 1 micron) on a thick p or n+ type layer obtained by any conventional process.

The crystallization temperature can be defined by the known method of X-ray diffraction by a layer of the material. Thus, it is known that a monocrystalline layer produces a regular diffraction pattern due to the cubic diamond structure of the crystals. In the case of an amorphous layer it is only possible to distinguish the halos characteristic of the tetrahedral arrangement of the atoms. The diffraction pattern obtained for amorphous deposits made at increasing but low temperatures is formed by the aforementioned halos. At a certain temperature T there is a progressive modification of the halos in the sense of a contraction. They are deformed into narrow diffraction lines characteristic of the crystal. This modification can easily be observed and makes it possible to accurately define the temperature T. Under given deposition conditions defined more particularly by the structure of the reactor in which the decomposition takes place and by the composition of the gaseous mixture, the crystallization temperature is equal to the temperature T defined hereinbefore. In the case of pure silicon it is approximately 650° C. In the case of temperatures up to 50° C. on either side of T the optical absorption coefficient is found to vary only slightly and is therefore close to its value for an amorphous layer deposited at low temperature. Moreover, the layer obtained is very homogeneous and there is a continuous distribution of defects and in particular non-fixed chemical bonds.

SECOND STAGE

This consists of the treatment of the deposited layer in a plasma of hydrogen or one of its isotopes or a mixture thereof. The treatment, which is performed at a temperature below the crystallization temperature (approximately 350° to 450° C.) serves to introduce hydrogen atoms into the non-fixed chemical bonds due to the quasi-amorphous nature of the deposited layer in order to passivate them. After treatment, lasting for example 15 minutes, for a doped sample there is an increase in the measured conductivity in such a way that the value obtained is of the same order of magnitude as that of a monocrystal of the same composition. The absorbing properties are retained in this treatment.

For example, the process of the invention was performed by depositing a 0.5 $\mu$m thick layer from a gaseous mixture constituted by silane and arsine at a rate of $10^4$ molecules of silane for one molecule of arsine. The mixture was diluted in hydrogen and heated to 600° C. for approximately 1 hour, the time necessary for deposition to be complete. The measured conductivity was then $7 \times 10^{-8} \Omega^{-1}$ cm$^{-1}$. A 15 minute treatment was then performed in a hydrogen plasma at 400° C. The conductivity became $70 \Omega^{-1}$ cm$^{-1}$, a gain of a factor of $10^9$. This high conductivity, close to the maximum values obtained for a monocrystal, indicates the mobility of the electrons, which is in fact close to that of a crystal. The measured absorption for a wavelength of 0.6 $\mu$m is $2 \times 10^4$ to $4 \times 10^4$ cm$^{-1}$.

When such layers are used for converting solar energy the conversion efficiency is limited by the electrical resistance of the layer. A slightly resistive layer of the type obtained by the process of the invention makes it possible to increase the efficiency compared with the efficiency levels obtained for an amorphous silicon layer.

For example, the method in the case of a metal-silicon junction will be described. A solar cell is shown in the drawing. It is formed from superimposed layers constituted by a metal substrate 1, an n+ doped silicon layer 2 (As/Si ratio = $10^{-3}$), a thin layer 3 of thickness 0.5 to 1 $\mu$m of n doped silicon (As/Si ratio = $10^{-6}$) and a metal layer 4, e.g. of platinum which is very thin (50 Å) so that it is transparent to solar radiation 6 to which layer 3 must be exposed. A metal stud 5 on layer 4 makes it possible to collect the current i obtained by the photovoltaic effect in layer 3. The photons traverse the metal layer 4 substantially unabsorbed. However, they are absorbed by the silicon layer 2 which, as has been stated hereinbefore, can have an absorption coefficient of approximately $2 \times 10^4$ cm$^{-1}$, so that for a layer thickness of 1 $\mu$m the absorbed radiation portion is equal to $1 - e^{-2} \gtrsim 1$. The absorbed photons generate electron-hole pairs which are dissociated in layer 3, thus liberating the electrons which can circulate in layer 4. In this way an electrical current i is obtained in metal layer 4 when the latter is connected to an external load circuit. It is also possible to obtain a current by providing junctions between two semiconducting layers, particularly p-n junctions, at least one of the layers being silicon or one of its alloys and produced by the process of the invention.

What is claimed is:

1. A process for producing a layer containing silicon, comprising depositing silicon by thermal decomposition of a gaseous mixture containing silane at a temperature (T) which is between 50° C. above and 50° C. below the crystallization temperature of the deposited material, and heat treating the deposited material in a plasma containing hydrogen, hydrogen isotopes or mixtures thereof, at a temperature below the temperature (T).

2. A process according to claim 1, wherein the layer contains pure silicon.

3. A process according to claim 2, wherein the layer is formed from a gas comprising silane.

4. Process according to claim 1, wherein the layer contains doped silicon of the n type.

5. A process according to claim 4, wherein the layer is formed from a gaseous mixture comprising silane and arsine in predetermined proportions.

6. A process according to claim 5, wherein decomposition is carried out at 600° C., the proportions being $10^4$ molecules of silane for one molecule of arsine.

7. A process according to claim 1, wherein the layer contains doped silicon of the p type.

8. A process according to claim 7, wherein the layer is formed from a gaseous mixture comprising silane and boron in predetermined proportions.

9. A process according to claim 1, wherein the gaseous mixture containing silane is diluted in hydrogen.

10. A solar cell incorporating a junction having a first layer containing silicon produced by the process of claim 1.

11. A solar cell according to claim 10, wherein the first layer is an n-type thin layer deposited on an underlying layer.

12. A solar cell according to claim 10, wherein the first layer is an n type thin layer deposited on a substrate and covered with a metal layer which is transparent to solar radiation.

13. A solar cell according to claim 12, wherein the metal layer is of platinum.

* * * * *